United States Patent
Yamazaki

(10) Patent No.: US 9,711,745 B2
(45) Date of Patent: *Jul. 18, 2017

(54) LIGHT EMITTING ELEMENT AND LIGHT EMITTING DEVICE

(75) Inventor: Hiroko Yamazaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 164 days.

This patent is subject to a terminal disclaimer.

(21) Appl. No.: 13/097,136

(22) Filed: Apr. 29, 2011

(65) Prior Publication Data

US 2011/0204353 A1 Aug. 25, 2011

Related U.S. Application Data

(63) Continuation of application No. 10/793,861, filed on Mar. 8, 2004, now Pat. No. 7,943,925.

(30) Foreign Application Priority Data

Mar. 17, 2003 (JP) ................................ 2003-072275

(51) Int. Cl.
  *H01L 51/30* (2006.01)
  *H01L 51/50* (2006.01)
  *H01L 51/00* (2006.01)

(52) U.S. Cl.
  CPC ...... *H01L 51/5016* (2013.01); *H01L 51/5036* (2013.01); *H01L 51/005* (2013.01);
  (Continued)

(58) Field of Classification Search
  CPC .................................................. H01L 51/504
  (Continued)

(56) References Cited

U.S. PATENT DOCUMENTS 4,769,242 A 9/1988 Shibanai
4,769,292 A 9/1988 Tang et al.
(Continued)

FOREIGN PATENT DOCUMENTS

JP 04-284395 A 10/1992
JP 2001-181617 A 7/2001
(Continued)

OTHER PUBLICATIONS

Adamovich et al., "High efficiency single dopant white electrophosphorescent light emitting diodes," New J. Chem., 2002, 26, 1171-1178.*

(Continued)

*Primary Examiner* — Jerome Jackson, Jr.
*Assistant Examiner* — Bo Fan
(74) *Attorney, Agent, or Firm* — Fish & Richardson P.C.

(57) ABSTRACT

A high efficient white emission light emitting element having peak intensity in each wavelength region of red, green, and blue is provided. Specifically, a white emission light emitting element having an emission spectrum that is independent of current density is provided. A first light emitting layer 312 exhibiting blue emission and a second light emitting layer 313 containing a phosphorescent material that generates simultaneously phosphorescent emission and excimer emission are combined. In order to derive excimer emission from the phosphorescent material, it is effective to disperse a phosphorescent material 323 having a high planarity structure such as platinum complex at a high concentration of at least 10 wt % to a host material 322. Further, the first light emitting layer 312 is provided to be in contact with the second light emitting layer 313 at the side of an anode. Ionization potential of the second light emitting layer 313 is preferably larger by 0.4 eV than that of the first light emitting layer 312.

24 Claims, 10 Drawing Sheets

(52) U.S. Cl.
CPC ...... *H01L 51/0036* (2013.01); *H01L 51/0037* (2013.01); *H01L 51/0059* (2013.01); *H01L 51/0062* (2013.01); *H01L 51/0077* (2013.01); *H01L 51/0078* (2013.01); *H01L 51/0081* (2013.01); *H01L 51/0084* (2013.01); *H01L 51/0085* (2013.01)

(58) Field of Classification Search
USPC .......... 257/40, 101–103, E51.022, E51.026, 257/E51.044, E31.041; 428/690; 313/504
See application file for complete search history.

(56) References Cited

U.S. PATENT DOCUMENTS

| | | | |
|---|---|---|---|
| 5,283,132 | A | 2/1994 | Ogura et al. |
| 5,753,426 | A | 5/1998 | Nair et al. |
| 6,097,147 | A | 8/2000 | Baldo et al. |
| 6,303,238 | B1 * | 10/2001 | Thompson ........... C07D 487/22 252/301.16 |
| 6,445,005 | B1 | 9/2002 | Yamazaki et al. |
| 6,447,934 | B1 * | 9/2002 | Suzuki ................ H01L 51/5036 257/103 |
| 6,656,608 | B1 | 12/2003 | Kita et al. |
| 6,657,260 | B2 | 12/2003 | Yamazaki et al. |
| 6,830,828 | B2 | 12/2004 | Thompson et al. |
| 6,863,997 | B2 | 3/2005 | Thompson et al. |
| 6,867,538 | B2 | 3/2005 | Adachi et al. |
| 6,869,695 | B2 | 3/2005 | Thompson et al. |
| 6,872,472 | B2 | 3/2005 | Liao et al. |
| 6,887,592 | B2 | 5/2005 | Hieda et al. |
| 6,893,743 | B2 | 5/2005 | Sato et al. |
| 6,894,312 | B2 | 5/2005 | Yamazaki et al. |
| 6,911,271 | B1 | 6/2005 | Lamansky et al. |
| 6,933,522 | B2 * | 8/2005 | Lin et al. ........................ 257/40 |
| 6,939,624 | B2 | 9/2005 | Lamansky et al. |
| 6,942,931 | B2 | 9/2005 | Lee et al. |
| 6,951,694 | B2 | 10/2005 | Thompson et al. |
| 7,060,370 | B2 | 6/2006 | Kinoshita et al. |
| 7,148,502 | B2 | 12/2006 | Yamazaki et al. |
| 7,163,746 | B2 | 1/2007 | Savage et al. |
| 7,211,823 | B2 | 5/2007 | Tung et al |
| 7,381,479 | B2 | 6/2008 | Lamansky et al. |
| 7,553,557 | B2 | 6/2009 | Thompson et al. |
| 7,553,560 | B2 | 6/2009 | Lamansky et al. |
| 7,663,300 | B2 * | 2/2010 | Hack ................... H01L 27/3211 313/498 |
| 7,943,925 | B2 * | 5/2011 | Yamazaki ....................... 257/40 |
| 2001/0050373 | A1 * | 12/2001 | Yamazaki et al. ........... 257/103 |
| 2002/0025419 | A1 | 2/2002 | Lee et al. |
| 2002/0027416 | A1 | 3/2002 | Kim et al. |
| 2002/0113546 | A1 | 8/2002 | Seo et al. |
| 2003/0017361 | A1 | 1/2003 | Thompson et al. |
| 2003/0054199 | A1 | 3/2003 | Oh |
| 2003/0067008 | A1 * | 4/2003 | Srivastava ......... C09K 11/7734 257/79 |
| 2003/0129452 | A1 | 7/2003 | Tsuji et al. |
| 2003/0137239 | A1 * | 7/2003 | Matsuura ............ H01L 51/5048 313/503 |
| 2003/0141809 | A1 | 7/2003 | Furugori et al. |
| 2004/0144974 | A1 | 7/2004 | Lee et al. |
| 2004/0151829 | A1 | 8/2004 | Boroson et al. |
| 2004/0169461 | A1 | 9/2004 | Moriyama et al. |
| 2004/0202893 | A1 | 10/2004 | Abe |
| 2004/0262576 | A1 | 12/2004 | Thompson et al. |
| 2004/0263066 | A1 | 12/2004 | Abe et al. |
| 2005/0077817 | A1 | 4/2005 | Yamazaki et al. |
| 2005/0100660 | A1 | 5/2005 | Ito et al. |
| 2005/0123791 | A1 | 6/2005 | Deaton et al. |
| 2005/0162092 | A1 | 7/2005 | Yamazaki et al. |
| 2005/0202278 | A1 | 9/2005 | Mishima et al. |
| 2006/0024526 | A1 | 2/2006 | Thompson et al. |
| 2011/0037061 | A1 | 2/2011 | Yamazaki et al. |

FOREIGN PATENT DOCUMENTS

| | | |
|---|---|---|
| JP | 2001-267077 A | 9/2001 |
| JP | 2002-334787 A | 11/2002 |
| JP | 2002-334789 A | 11/2002 |
| JP | 2003-012777 A | 1/2003 |
| JP | 2003-045676 A | 2/2003 |
| JP | 2004-506305 A | 2/2004 |
| JP | 2005-514754 A | 5/2005 |
| WO | WO 02/15645 A1 | 2/2002 |
| WO | WO 03/059015 A1 | 7/2003 |

OTHER PUBLICATIONS

Adamovich et al. "High efficiency single dopant white electrophosphorescent light emitting diodes," New J. Chem., 2002, 26, 1171-1178.*
C.W. Tang et al.; "Organic Electroluminescent Diodes"; Applied Physics Letters 51(12); pp. 913-915; Sep. 21, 1987.
Junji Kido et al.; "Multilayer White Light-Emitting Organic Electroluminescent Device"; Science, vol. 267; pp. 1332-1334; Mar. 3, 1995.
Kido et al, "The 46th Japan Society of Applied Physics and Related Societies"; Extended Abstract No. 3, p. 1281 28a-ZD-25 "Bright White-light-emitting Organic EL Device", Mar. 28, 1999 Full Translation.
Brian W. D'Andrade et al.; "White Light Emission Using Triplet Excimers in Electrophosphorescent Organic Light-Emitting Devices"; Advanced Materials, vol. 14, No. 15; pp. 1032-1036; Aug. 5, 2002.
Siu-Wai Lai et al.; Probing d8-d8 Interactions in Luminescent Mono- and Binuclear Cyclometalated Platinum (II) Complexes of 6-Phenyl-2,2'-bipyridines; Inorganic Chemistry, vol. 38, No. 18; pp. 4046-4055; 1999.
Siu-Wai Lai et al.; "Spectroscopic Properties of Luminescent Platinum (II) Complexes Containing 4,4',4"—Tri-tert-butyl-2,2':6',2"-terpyridine (tBu3tpy). Crystal Structures of [Pt(tBu3tpy)Cl]ClO4 and [Pt(tBu3tpy){CH2C(O)Me}ClO4]"; Inorganic Chemistry, vol. 38, No. 19; pp. 4262-4267; 1999.
Per-Inge Kvam et al.; "Spectroscopic and Electrochemical Properties of Some Mixed-Ligand Cyclometalated Platinum (II) Complexes Derived from 2-Phenylpyridine" Acta Chemica Scandinavica, vol. 49; pp. 335-343; 1995.
Office Action dated Sep. 20, 2006 (U.S. Appl. No. 10/819,282), 8 pages.
"Highly efficient phosphorescent emission from organic electroluminescent devices", Baldo et al., Nature, vol. 395, pp. 151-154, Sep. 1998.
Office Action and translation issued in corresponding Japanese Application JP200410039782.6 on Sep. 26, 2008, 18 pages.
Korean Office Action (Korean Patent Application No. 10-2011-00045497) mailed Mar. 8, 2011 with English translation.
Adamovich, V. et al., High efficiency single dopant white electrophosphorescent light emitting diodes, New Journal of Chemistry, Aug. 12, 2002, vol. 26, No. 9, pp. 1171-1178.
Kim, C. et al., Bright small molecular white organic light-emitting devices with two emission zones, Applied Physics Letters, Mar. 25, 2002, vol. 80, No. 12, pp. 2201-2203.
Junji Kido et al.; "Multilayer White Light-Emitting Organic Electroluminescent Device"; Science, vol. 267; No. 5202; pp. 1332-1334; Mar. 3, 1995.
Korean Office Action (Korean Patent Application No. 10-2011-0004597) mailed Mar. 8, 2011 with English translation.

* cited by examiner

LIGHT EMITTING ELEMENT AND LIGHT EMITTING DEVICE

CROSS-REFERENCE TO RELATED APPLICATIONS

This application is a continuation of U.S. application Ser. No. 10/793,861, filed Mar. 8, 2004, now allowed, which claims the benefit of a foreign priority application filed in Japan as Serial No. 2003-072275 on Mar. 17, 2003, both of which are incorporated by reference.

BACKGROUND OF THE INVENTION

1. Field of the Invention

The present invention relates to a light emitting element that comprises an anode, a cathode, and a layer containing an organic compound (hereinafter, electroluminescent layer) that generates light by applying electric field through the electrodes; and a light emitting device that comprises the light emitting element. Specifically, the present invention relates to a light emitting element that exhibits white emission and a full color light emitting device comprising the light emitting element.

2. Related Art

A light emitting element emits light when electric field is applied thereto. The emission mechanism is a carrier injection type. That is, by applying voltage through a pair of electrodes that interposes an electroluminescent layer therebetween, electrons injected from a cathode and holes injected from an anode are recombined within the electroluminescent layer to form molecules in excited states (hereinafter, excited molecule), and the excited molecules return to the ground state while radiating energy to emit photon.

There are two excited states possible from organic compounds, the singlet state and the triplet states. Light emission from the singlet state is referred to as fluorescence and the same from the triplet state is referred to as phosphorescence.

In such light emitting element, an electroluminescent layer is generally formed to have a thickness of below 1 μm. Further, since a light emitting element is a self-luminous element in which an electroluminescent layer emits photon, a back light used for the conventional liquid crystal display device is unnecessary. Therefore, a light emitting element has a great advantage of being manufactured to have a ultra thin film thickness and light weight.

In the case of an electroluminescent film with a thickness of approximately 100 nm, the time between the injection of carriers and their recombination is about several ten nanoseconds considering the carrier mobility. Hence, the time required for the process of injecting carriers and emitting light of the electroluminescent layer is on the order of microsecond. Thus, an extremely high response speed is one of the advantages thereof.

Further, since a light emitting element is carrier injection type, it can be driven by a direct current voltage, thereby noise is hardly generated. With respect to a drive voltage, an electroluminescent layer is formed into a uniform ultra thin film having a thickness of approximately 100 nm, and a material for an electrode is selected to reduce a carrier injection barrier. Further, a hetero structure (two-layers structure) is introduced. Accordingly, a sufficient luminance of 100 cd/m$^2$ can be obtained at an applied voltage of 5.5V (reference 1: C. W. Tang and S. A. VanSlyke, Applied Physics Letters, vol. 51, No. 12, pp. 913-915 (1987)).

A light emitting element has been attracted attention as a next generation's device for a flat panel display in terms of the thin thickness and light weight, the high response speed, the direct low voltage operation, or the like. In addition, a light emitting element can be used effectively as the device for the display screen of a portable electric appliance in terms of the self luminous type, the wide viewing angle, and the high level of visibility.

Wide variations of emission color is also one of the advantages of a light emitting element. Richness of color is resulted from the multiplicity of an organic compound itself. That is, an organic compound is flexible enough to be developed to various materials by designing molecules (such as introducing substituent). Accordingly, a light emitting element is rich in color.

From these viewpoints, it would not be an overstatement to say that the biggest application areas of a light emitting element is a full color flat panel display device. Various means for full colorization have been developed in view of characteristics of a light emitting element. At present, there are three primary methods of forming the structure of a full color light emitting device by using a light emitting element.

First, the method that light emitting elements having three primary colors, that is, red (R), green (G), and blue (B) are patterned, respectively, by shadow mask technique to serve them as pixels (hereinafter, RGB method). Second, a blue light emitting element is used as a light emission source, and the blue emission is converted into green or red by color changing material (CCM) made from phosphorescent material to obtain three primary colors (hereinafter, CCM method). Third, a white light emitting element is used as a light emission source, and a color filter (CF) used for a liquid crystal display device or the like is provided to obtain three primary colors (hereinafter, CF method).

Of these methods, the CCM method and the CF method do not require such elaborate patterning required in the RGB method since a light emitting element used in the CCM method and the CF method exhibits single color such as white (CCM method) or blue (CF method). The CCM materials or color filter can be made by the conventional photolithography technique without complicated processes. Further, in addition to these advantages with respect to processes, the change in luminance with time of each color is uniform since only one kind of device is used.

However, in case of adopting the CCM method, there has been a problem in red color since color conversion efficiency of from blue to red is poor in principle. In addition, there has been a problem that the contrast becomes deteriorated since a color conversion material itself is fluorescent so that light is generated in pixels due to outside light such as sunlight. CF method has no such problems since a color filter is used as well as the conventional liquid display device.

Accordingly, although the CF method has comparative few disadvantages, the CF method has a problem that a high efficient white light emitting element is indispensable to the CF method since a great deal of light is absorbed into a color filter. A mainstream white light emitting element is the device that combines complementary colors (such as blue and yellow) (hereinafter, two wavelengths white light emitting device) instead of white color having the peak intensity in each wavelength of R, G, and B (reference 2: Kido et al., "46$^{th}$ Applied Physics Relation Union Lecture Meeting" p 1282, 28a-ZD-25 (1999)).

However, considering a light emitting device combined with a color filter, a white light emitting element having an emission spectrum with the peak intensity in each wavelength of R, G, and B (hereinafter, three wavelengths white light emitting device) is desirable instead of the two wavelengths white light emitting device, which was reported in the reference 2.

Such three wavelengths white light emitting device has been disclosed in some references (reference 3: J. Kido at al., Science, vol. 267, 1332-1334 (1995)). However, such three wavelengths white light emitting device is inferior to the two wavelengths white light emitting device in terms of luminous efficiency, consequently, significant improvement is required. In addition, it is difficult for the three wavelengths white light emitting device to obtain stable white emission due to change in color with time or change in spectrum depending on the current density.

SUMMARY OF THE INVENTION

In view of the foregoing, it is an object of the present invention is to provide a high efficient white emission device having the emission peak intensity in each wavelength region of red, green, and blue. A further object of the invention is to provide a white emission device having the emission spectrum, which does not depend on the current density.

An even further object of the invention is to provide a light emitting device, which operates at lower power and hardly has color shift compared with the conventional light emitting device by manufacturing a light emitting device using the light emitting element.

The inventor found out the means for solving the problems after their earnest consideration by combining a first light emitting layer exhibiting blue emission and a second light emitting layer exhibiting simultaneously both phosphorescent emission and excimer emission.

A phosphorescent material can convert the triplet excited state to light emission, that is, generate phosphorescent emission. In a light emitting element, it is considered that singlet excited state and triplet excited state are generated in the ratio of 1:3. Accordingly, it is known that high light emission efficiency can be achieved by using a phosphorescent material.

According to the invention, since a second light emitting layer is formed by a phosphorescent material that can generate simultaneously both phosphorescent emission and excimer emission, the second light emitting layer can exhibit light emission having at least two peaks intensity. Excimer emission is at the longer wavelength side compared with the phosphorescent emission. Therefore, by designing the two peaks of intensity to be in the wavelength region of from green to red, a high efficient light emitting device having the peak intensity in each wavelength region of red, green, blue can be obtained.

The constitution of the invention is a light emitting element that comprises, between an anode and a cathode, a first light emitting layer exhibiting blue emission; and a second light emitting layer containing a phosphorescent material, and generating phosphorescent emission from the phosphorescent material and excimer emission from the phosphorescent material, simultaneously.

A first light emitting layer may contain a host material dispersed with a guest material exhibiting blue emission. Therefore, the constitution of the invention is a light emitting element that comprises, between an anode and a cathode, a first light emitting layer containing a host material dispersed with a guest material exhibiting blue emission; and a second light emitting layer containing a phosphorescent material, and generating phosphorescent emission from the phosphorescent material and excimer emission from the phosphorescent material, simultaneously.

The inventor found out that it is effective to disperse a phosphorescent material to a host material at a high concentration of at least 10 wt % in order to derive excimer emission from the phosphorescent material. Therefore, the constitution of the invention is a light emitting element that comprises, between an anode and a cathode, a first light emitting layer exhibiting blue emission; and a second light emitting layer containing a host material dispersed with a phosphorescent material at concentration of at least 10 wt %, and generating phosphorescent emission from the phosphorescent material and excimer emission from the phosphorescent material, simultaneously.

In addition, the first light emitting layer may contain a host material dispersed with a guest material exhibiting blue emission. Therefore, the constitution of the invention is a light emitting element that comprises, between an anode and a cathode, a first light emitting layer containing a first host material dispersed with a first guest material exhibiting blue emission; and a second light emitting layer containing a second host material dispersed with a phosphorescent material at concentration of at least 10 wt %, and generating phosphorescent emission from the phosphorescent material and excimer emission from the phosphorescent material, simultaneously.

In a light emitting element according to above constitutions, the first light emitting layer is provided to be in contact with the second light emitting layer at a side of the anode, and ionization potential of the second light emitting layer is larger by at least 0.4 eV than that of the first light emitting layer.

In case that the first light emitting layer contains a host material dispersed with a guest material exhibiting blue emission, the first light emitting layer is preferably provided to be in contact with the second light emitting layer at a side of the anode, and ionization potential of the second light emitting layer is preferably larger by at least 0.4 eV than that of the host material in a thin film shape.

In case that the second light emitting layer contains a host material dispersed with a guest material exhibiting blue emission, the first light emitting layer is preferably provided to be in contact with the second light emitting layer at a side of the anode, and ionization potential of the host material in a thin film shape is preferably larger by at least 0.4 eV than that of the first light emitting layer.

In case that the first light emitting layer contains a host material dispersed with a guest material exhibiting blue emission and in case that the second light emitting layer contains a host material dispersed with a guest material exhibiting blue emission, the first light emitting layer is preferably provided to be in contact with the second light emitting layer at a side of the anode, and ionization potential of the second host material in a thin film shape is preferably larger by at least 0.4 eV than that of the first host material in a thin film shape.

In the above constitution of the invention, an emission spectrum with maximum intensity of the first light emitting device is preferably in a wavelength region of at least 400 and at most 500 nm. In addition, the phosphorescent material has an emission spectrum with at least two peaks intensity at a region of at least 500 and at most 700 nm, and either at least the two peaks is excimer emission, preferably. Further, it is effective to combine the above emission for obtaining excellent white emission.

In the invention, an organic metal complex with platinum as a central metal is preferably used as the phosphorescent material.

By manufacturing a light emitting device using the light emitting element according to the invention, a light emitting device, which operates at low power and has hardly color shift, can be provided. Therefore the invention includes a light emitting device using the light emitting element according to the invention.

Especially, it is effective to apply the light emitting element according to the invention to a full color light emitting device with a color filter since the light emitting element can achieve high efficient white emission having the peak in each red, green and blue wavelength.

As used herein, the term "light emitting device" refers to an image display device, or the like. Further, a module having a light emitting element attached with a connector such as FPC (Flexible Printed Circuit), TAB (Tape Automated Bonding), or TCP (Tape Carrier Package); a module having TAB or TCP provided with a printed wiring board; and a module having a light emitting element installed directly with IC (Integrated Circuit) by COG (Chip On Glass) are all included in the light emitting device.

DESCRIPTION OF THE INVENTION

Figure 1A:
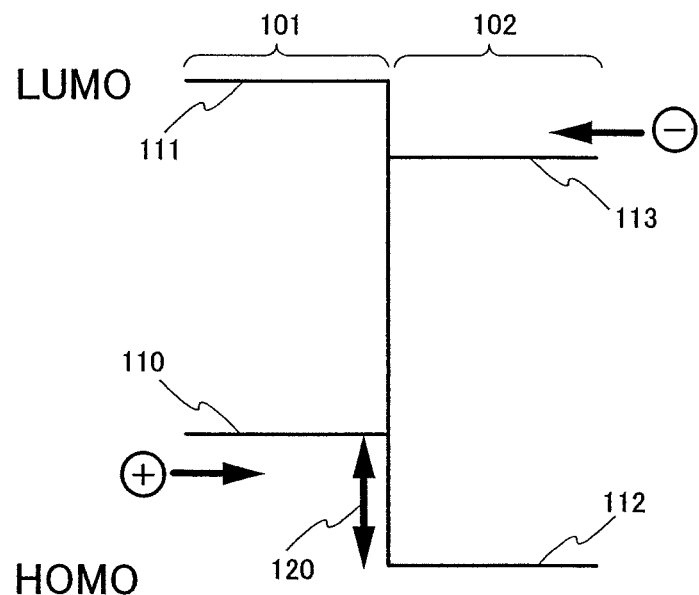
FIGS. 1A and 1B are band diagrams of a light emitting element according to the present invention.

Hereinafter, embodiments of the present invention will be described in detail with reference to the principal of operation and the specific examples of the device configuration. Although the present invention will be fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein. Either electrode of a light emitting element may be transparent since light is extracted from the either electrode. Therefore, not only the conventional configuration that light is extracted from a substrate provided with a transparent electrode, but also the configuration that light is extracted from the side opposing to the substrate or the configuration that light is extracted from both side of the electrode can be applied actually to the light emitting device.

The basic concept of the invention is to apply a first light emitting layer exhibiting blue emission and a second light emitting layer comprising a phosphorescent material, which generates simultaneously both phosphorescent emission and excimer emission.

Excimer emission is always at the longer wavelength side (specifically, at least several ten nm distant from normal emission) compared with the normal emission (phosphorescent emission in case of a phosphorescent material). Consequently, excimer emission of a phosphorescent material generating phosphorescent emission in green wavelength region is at red wavelength region. Therefore, a high efficient light emitting element having peak intensity in each wavelength region of red, green, and blue can be achieved by adopting the underlying concept of the invention.

As a first light emitting layer exhibiting the blue emission, a layer formed by a single substance (blue luminous body), or a layer formed by dispersing a guest material serving a blue luminous body to a host material.

Further, it is necessary that both phosphorescent emission and excimer emission are generated from a phosphorescent material in order to complete the invention. Specifically, there is a technique that a phosphorescent material having a high planarity structure such as platinum complex is used as a guest material, and the phosphorescent material is doped at high concentration (more specifically, at least 10 wt %). By doping the phosphorescent material at least 10 wt % in concentration, mutual action of the phosphorescent material each other is increased, and excimer emission is derived. Alternatively, the technique that a phosphorescent material is not used as a guest material but as a thin film light emitting layer or a dotted light emission region is acceptable. However, the way of deriving excimer emission from a phosphorescent material is not limited thereto.

From a device configuration perspective, the device configuration is necessary to be designed to generate light in both the first light emitting layer and the second light emitting layer. As a means of designing the configuration, the first light emitting layer having hole transportation properties is provided to come in contact with the second light emitting layer and to be interposed between the second light emitting layer and an anode via other layers; and ionization potential of the second light emitting layer is sufficiently increased compared with that of the first light emitting layer.

The band diagram for explaining the principle is shown in FIG. 1A. FIG. 1A shows the HOMO level (ionization potential) 110 and the LUMO level 111 of a first light emitting layer 101, the HOMO level (ionization potential) 112 and the LUMO level 113 of the second light emitting layer 102, respectively.

In this instance, in case that energy gap 120 between the ionization potential 110 of the first light emitting layer 101 and the ionization potential 112 of the second light emitting layer 102 is small, holes are penetrating from the first light emitting layer 101 into the second light emitting layer 102. Then, almost carriers are eventually recombined within the second light emitting layer 102 since the first light emitting layer 101 has hole transportation properties. Accordingly, the second light emitting layer 102 exhibits light emission in green wavelength region and red wavelength region. Consequently, the second light emitting layer 102 cannot transfer energy to the first light emitting layer 101, which exhibits blue emission at short wavelength side, and only the second light emitting layer 102 generates light.

For preventing the phenomenon, the energy gap 120 may be sufficiently increased. Accordingly, almost carriers are recombined at the vicinity of the boundary face of the first light emitting layer 101 and the second light emitting layer 102. Then, both the first light emitting layer 101 and the second light emitting layer 102 can exhibit light by the recombination of the small numbers of carriers within the second light emitting layer 102, or the partly energy transfer, the energy is generated by the recombination in the first light emitting layer 101, from the first light emitting layer 101 to the second light emitting layer 102. In addition, the energy gap 120 may be, specifically, at least 0.4 eV. From some results of experiment, there are many cases where both the first light emitting layer and the second light emitting layer generate light at energy gap 120 of 0.4 eV.

The same is equally true of the case where the configuration that a guest material generating blue emission is dispersed in a host material. That is, the ionization potential of the second light emitting layer 102 is preferably larger by at least 0.4 eV than that of the whole first light emitting layer 101 (in the state that a guest material generating blue emission is dispersed in a host material of the first light emitting layer).

Figure 1B:
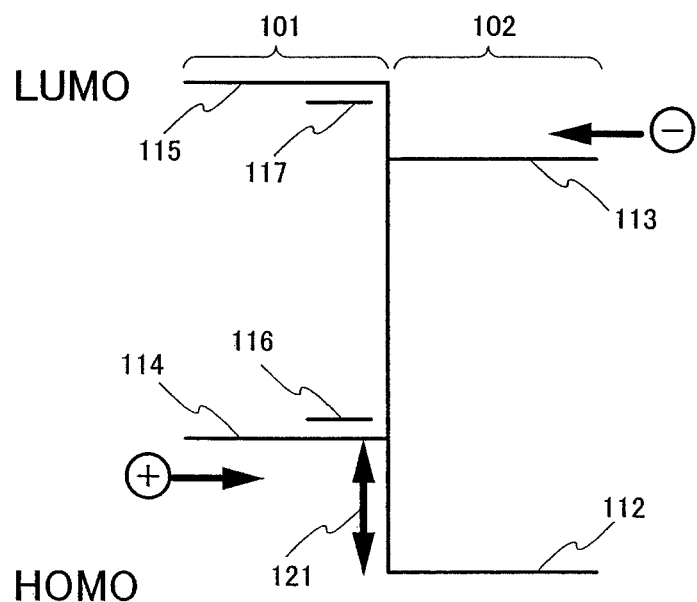

More preferably, the ionization potential of the second light emitting layer 102 is larger by 0.4 eV than that of the host material of the first light emitting layer in a thin film shape. The principle is explained with reference to band diagram shown in FIG. 1B. FIG. 1B shows the HOMO level (ionization potential) 114 and the LUMO level 115 of the host material of the first light emitting layer in a thin film shape, and the HOMO level (ionization potential) 116 and the LUMO level 117 of a guest material generating blue emission, respectively. Another components are denoted by like numerals as of FIG. 1A.

In FIG. 1B, holes are transported into the HOMO level (ionization potential) 114 of the host material of the first light emitting layer in a thin film shape. Therefore, the energy gap 121 between the ionization potential 112 of the second light emitting layer 102 and the ionization potential 114 of the host material of the first light emitting layer in a thin film shape is preferably at least 0.4 eV.

Figure 2A:
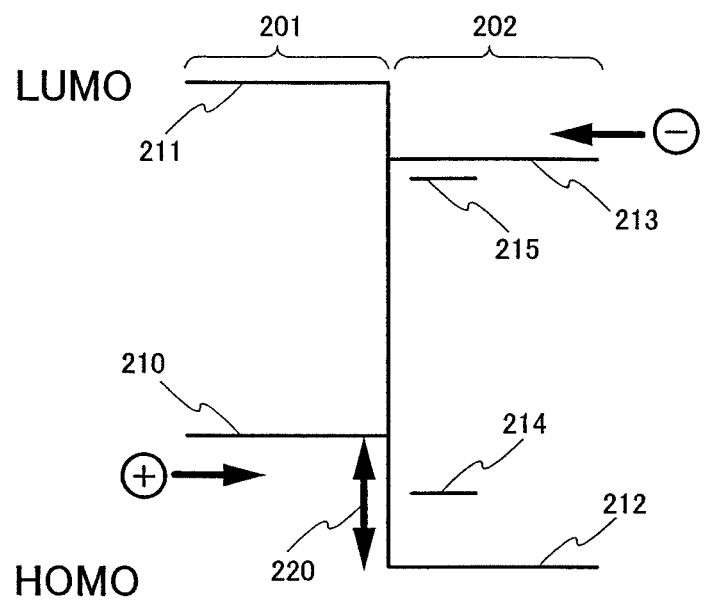
FIGS. 2A and 2B are band diagrams of a light emitting element according to the invention.

The principle with respect to the case of using a phosphorescent material as a guest material will be explained. FIG. 2A is the band diagram. FIG. 2A shows the HOMO level (ionization potential) 210 and the LUMO level 211 of a first light emitting layer 201, the HOMO level (ionization potential) 212 and the LUMO level 213 of the host material of a second light emitting layer 202 in a thin film shape, and the HOMO level (ionization potential) 214 and the LUMO level 215 of the guest material (phosphorescent material) of a second light emitting layer 202, respectively.

In this instance, as well as the case explained with reference to FIGS. 1A and 1B, the ionization potential of the whole second light emitting layer 202 (in the state that a phosphorescent material is dispersed in the host material of the second light emitting layer) is preferably larger by at least 0.4 eV than that of the first light emitting layer 201.

More preferably, the ionization potential 212 of the host material of the second light emitting layer in a thin film shape is larger by at least 0.4 eV than the ionization potential 210 of the first light emitting layer 201.

In such state, almost holes are accumulated at the vicinity of boundary face of the first light emitting layer 201 and the second light emitting layer 202 since the energy gap 220 is large. However, a part of the holes are trapped into HOMO level 214 of a phosphorescent material. Therefore both the first light emitting layer 201 and the second light emitting layer 202 can exhibit light emission.

In case of adopting the configuration that a guest material generating blue emission is dispersed in a host material to the first light emitting layer 201, as well as the case described with reference to FIGS. 1A and 1B, the ionization potential of the whole second light emitting layer 202 (in the state that a phosphorescent material is dispersed in the host material of the second light emitting layer) is preferably larger by at least 0.4 eV than that of the whole first light emitting layer 201 (in the state that a guest material generating blue emission is dispersed in the host material of the first light emitting layer).

Figure 2B:
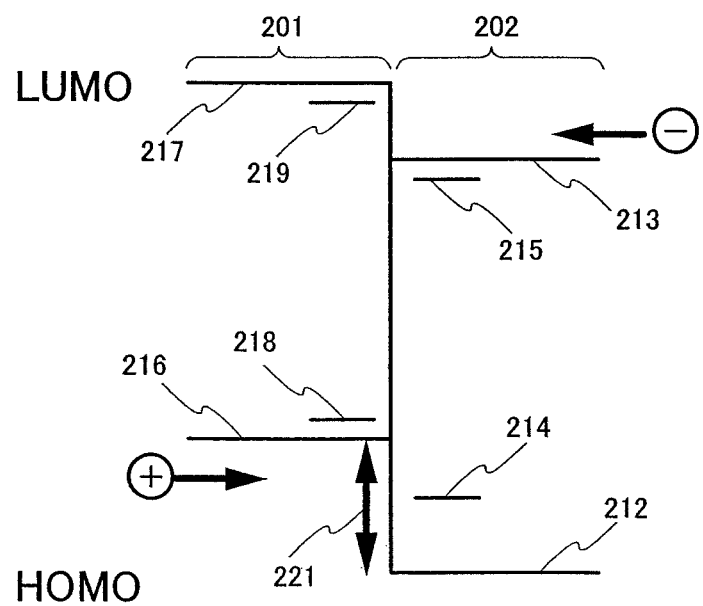

More preferably, the ionization potential of the host material of the second light emitting layer in a thin film shape is larger by at least 0.4 eV than that of the host material of the first light emitting layer in a thin film shape. The principle is explained with reference to a band diagram in FIG. 2B. FIG. 2B shows the HOMO level (ionization potential) 216 and the LUMO level 217 of the host material of the first light emitting layer in a thin film shape and the HOMO level (ionization potential) 218 and the LUMO level 219 of the guest material generating blue emission. Another components are denoted by like numerals as of FIG. 2A.

In FIG. 2B, holes are transported into the HOMO level 216 of the host material of the first light emitting layer in a thin film shape. Therefore, in case that the energy gap between the ionization potential 212 of the host material of the second light emitting layer 202 in a thin film shape and the ionization potential 216 of the host material of the first light emitting layer 201 is at least 0.4 eV, the phenomenon described with reference to FIG. 2A is resulted, consequently, both the first light emitting layer and the second light emitting layer exhibit light emission.

Hereinafter, the device configuration of a light emitting element according to the invention will be explained. An electroluminescent layer of the light emitting element according to the invention comprises at least the above described first light emitting layer and second light emitting layer. Further, layers having other properties than light emission, which are known as the components of the conventional light emitting element, such as a hole injecting layer, a hole transporting layer, an electron transporting layer, and an electron transporting layer can be appropriately included.

Materials that can be used for each the layers will be illustrated in specific. However, the materials that can be applied to the invention are not limited thereto.

As a hole injection material for forming a hole transporting layer, porphyrin compounds are useful among other organic compounds such as phthalocyanine (abbreviated $H_2$-Pc), copper phthalocyanine (abbreviated Cu-Pc), or the like. Further, chemical-doped conductive polymer compounds can be used, such as polyethylene dioxythipophene (abbreviated PEDOT) doped with polystyrene sulfonate (abbreviated PSS), polyaniline (abbreviated PAni), polyvinyl carbazole (abbreviated PVK), or the like. A thin film of an inorganic semiconductor such as vanadium pentoxide or a ultra thin film of an inorganic insulator such as aluminum oxide can also be used.

As a hole transportation material for using a hole transporting layer, aromatic amine (that is, the one having a benzene ring-nitrogen bond) compounds are preferably used. For example, N,N'-bis(3-methylphenyl)-N,N'-diphenyl-1,1'-biphenyl-4,4'-diamine (abbreviated TPD) or derivatives thereof such as 4,4'-bis[N-(1-naphthyl)-N-phenylamino]-biphenyl (hereafter, referred to as α-NPD) is widely used. Also used are star burst aromatic amine compounds, including: 4,4',4"-tris(N,N-diphenyl-amino)-triphenyl amine (hereafter, referred to as TDATA); and 4,4',4"-tris[N-(3-methylphenyl)-N-phenyl-amino]-triphenyl amine (hereafter, referred to as "MTDATA").

As electron transportation materials for forming an electron transporting layer, in specific, metal complexes such as tris(8-quinolinolate) aluminum (abbreviated $Alq_3$), tris(4-methyl-8-quinolinolate) aluminum (abbreviated $Almq_3$), bis (10-hydroxybenzo[h]-quinolinato) beryllium (abbreviated $BeBq_2$), bis(2-methyl-8-quinolinolate)-(4-hydroxy-biphenylyl)-aluminum (abbreviated BAlq), bis [2-(2-hydroxyphenyl)-benzooxazolate] zinc (abbreviated $Zn(BOX)_2$), and bis [2-(2-hydroxyphenyl)-benzothiazolate] zinc (abbreviated $Zn(BTZ)_2$). Besides, oxadiazole derivatives such as 2-(4-biphenyl)-5-(4-tert-butylphenyl)-1,3,4-oxadiazole (abbreviated PBD), and 1,3-bis[5-(p-tert-butylphenyl)-1,3,4-oxadiazole-2-yl] benzene (abbreviated OXD-7); triazole derivatives such as 3-(4-tert-butylphenyl)-4-phenyl-5-(4-biphenylyl)-1,2,4-triazole (abbreviated TAZ) and 3-(4-tert-butylphenyl)-4-(4-ethylphenyl)-5-(4-biphenylyl)-1,2,4-triazole (abbreviated p-EtTAZ); imidazol derivatives such as 2,2',2"-(1,3,5-benzenetriyl)tris[1-phenyl-1H-benzimidazole] (abbreviated TPBI); and phenanthroline derivatives such as bathophenanthroline (abbreviated BPhen) and bathocuproin (abbreviated BCP) can be used in addition to metal complexes.

As electron injection material for forming an electron injecting layer, above described electron transportation materials can be used. Besides, a ultra thin film of insulator, for example, alkaline metal halogenated compounds such as LiF, CsF, or the like; alkaline earth halogenated compounds such as $CaF_2$ or the like; or alkaline metal oxides such as $Li_2O$ is often used. In addition, alkaline metal complexes such as lithium acetylacetonate (abbreviated Li(acac)), 8-quinolinolato-lithium (abbreviated Liq), or the like can also be used.

As a luminous body in the first light emitting layer, blue fluorescent materials having hole transportation properties such as above described TPD, α-NPD, or the like; or blue fluorescent materials having electron transportation properties such as Balq, $Zn(BOX)_2$, or the like. Various blue fluorescent dyes, for example, perylene, 9,10-diphenyl anthracene, coumarin based fluorescent dyes (coumarin 30 or the like) can be used as a guest material. Further, phosphorescent materials such as bis(4,6-difluorophenyl) pyridinato-N,$C^{2'}$) (acetylacetonato)iridium (abbreviated $Ir(Fppy)_2(acac)$) can be used. All of these materials have emission peak intensity in the wavelength of from 400 to 500 nm, so that they are suitable for materials for the luminous body of the first light emitting layer according to the invention.

As the luminous body of the second light emitting layer, an organic metal complex, with platinum as the central metal, is effectively used. Specifically, if materials represented by the following structural formulas 1 to 4 dispersed in a host material in high concentration, both phosphorescent emission and excimer emission can be derived. However, the invention is not limited thereto, any phosphorescent material can be used, as long as it can generate phosphorescent emission and excimer emission.

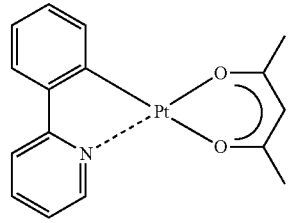

Formula 1

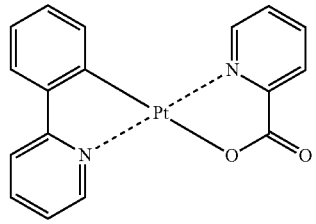

Formula 2

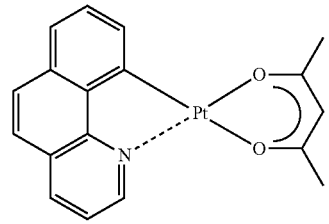

Formula 3

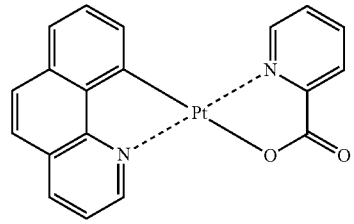

Formula 4

In case of using guest materials for the first light emitting layer and the second light emitting layer, the hole transportation materials or electron transportation materials typified by the above described examples can be used as the host material. In addition, a bipolar material such as 4,4'-N,N'-di carbazolyl-biphenyl (abbreviated CBP) can be used.

As a material for an anode of the light emitting element according to the invention, a conductive material having large work function is preferably used. In case of extracting light through an anode, a transparent conductive material such as indium-tin oxide (ITO), indium-zinc oxide (IZO), or the like may be used for forming the anode. In case of forming an anode to have a light blocking effect, a single layered film such as TiN, ZrN, Ti, W, Ni, Pt, Cr, or the like; a lamination layered film of a titanium nitride film and a film containing aluminum as its main components; a three layered film of a titanium nitride film, a film containing aluminum as its main components, and a titanium nitride film can be used for forming the anode. Alternatively, an anode having a light blocking effect can be formed by stacking the above described conductive material over a reflective electrode such as Ti, Al, or the like.

As a material for a cathode, conductive materials having small work function is preferably used. Specifically, alkaline metals such as Li, Cs, or the like; alkaline earth metals such as Mg, Ca, Sr, or the like; alloys of theses metals (Mg: Ag, Al: Li, or the like); or rare earth metals such as Yb, Er, or the like. In addition, in case of using an electron injecting layer such as LiF, CsF, CaF$_2$, Li$_2$O, or the like, the conventional conductive thin film such as aluminum can be used. In case of extracting light through cathode, alkaline metals such as Li, Cs, or the like, or a lamination structure comprising a ultra thin film containing alkaline earth metals such as Mg, Ca, Sr, or the like and a transparent conductive film (ITO, IZO, ZnO, or the like). Alternatively, the cathode having a light blocking effect is formed by forming an electron injecting layer by alkaline metals or alkaline earth metals, and electron transportation materials by co-evaporation and stacking a transparent conductive film (ITO, IZO, ZnO, or the like) thereon.

Figure 3:
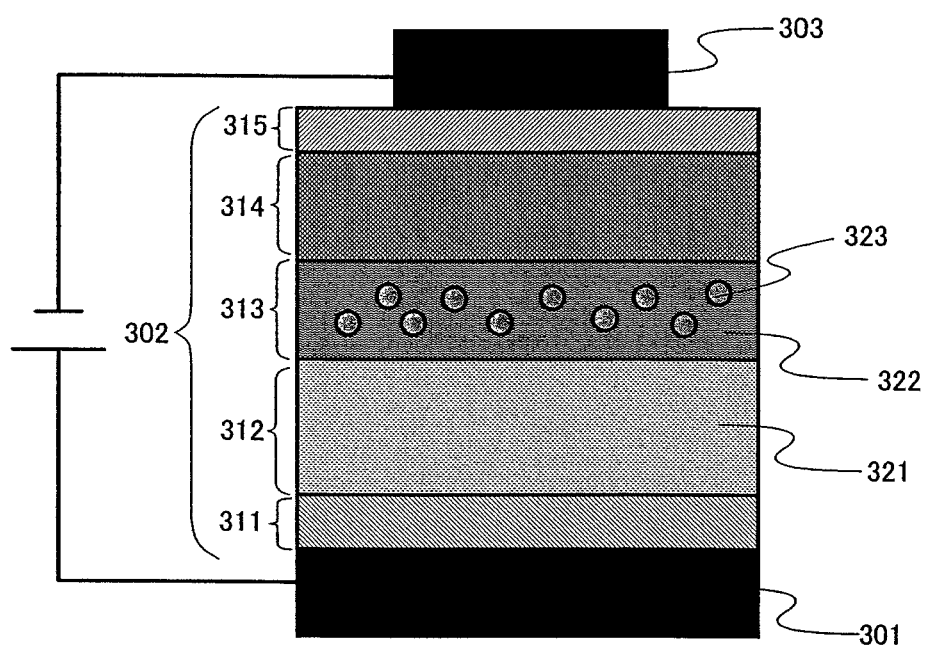
FIG. 3 shows a device configuration of a light emitting element according to the invention.
Figure 4:
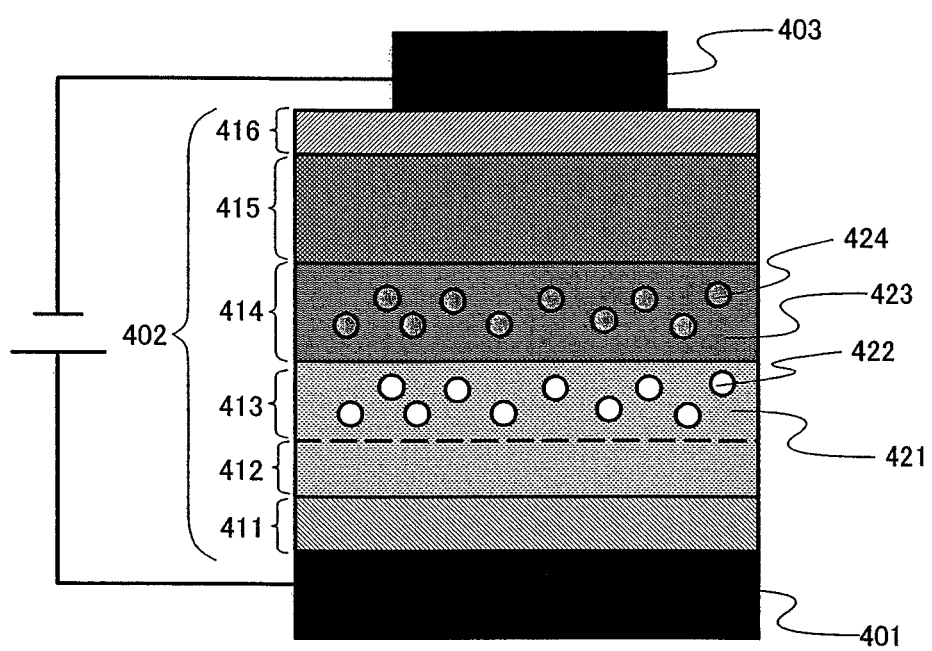
FIG. 4 shows a device configuration of a light emitting element according to the invention.

FIGS. 3 and 4 show examples of the light emitting element according to the invention. However, the invention is not limited thereto.

FIG. 3 shows the device configuration having an electroluminescent layer 302 interposed between an anode 301 and a cathode 303. The device comprises an anode 301, a hole injecting layer 311, a first light emitting layer 312, a second light emitting layer 313, an electron transporting layer 314, and a hole injecting layer 315, sequentially. Here, the first light emitting layer 312 is composed of a luminous body having hole transporting properties such as α-NPD. In the second light emitting layer 313, a phosphorescent material 323 such as platinum complexes (represented by above structural formulas 1 to 4) is dispersed in a host material 322 in high concentration (specifically, at least 10 wt %). Consequently, both phosphorescent emission and excimer emission is derived.

By practicing the present invention, a white light emitting element having such simple configuration can be provided having emission peak intensity in each wavelength of red, green, and blue. Further, the device shown in FIG. 3 can exhibit stable white emission without changing the shape of emission spectrum even when current density is changed or the element is continuously operated since only one kind of doping material (a phosphorescent material 323) is used to the device.

FIG. 4 shows the configuration having an electroluminescent layer 402 interposed between an anode 401 and a cathode 403. The device comprises an anode 401, a hole injecting layer 411, a hole transporting layer 412, a first light emitting layer 413, a second light emitting layer 414, an electron transporting layer 415, and a hole injecting layer 416, sequentially. In the first light emitting layer 413, a hole transportation material 421 used for the hole transporting layer 412 is used as host and a blue luminous body 422 such as perylene is used as guest. In the second light emitting layer 414, a phosphorescent material 424 such as platinum complexes (represented by above structural formulas 1 to 4) is dispersed in a host material 423 in high concentration (specifically, at least 10 wt %). Consequently, both phosphorescent emission and excimer emission is derived.

A method for stacking each layer of the light emitting element according to the invention is not limited. Any method for stacking such as vacuum vapor deposition, spin coating, ink jetting, dip coating, or the like can be used, as long as layers can be stacked by these methods.

EXAMPLES

Hereinafter, examples of the present invention will be explained.

Example 1

Figure 5:
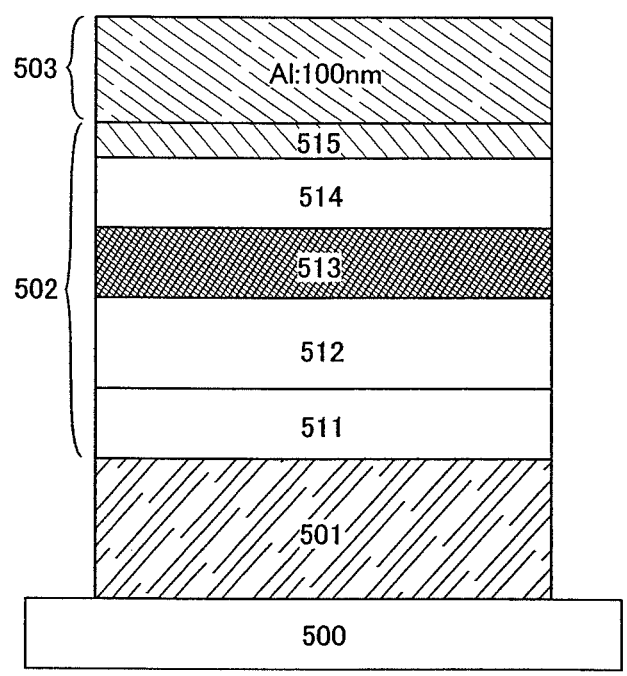
FIG. 5 shows specifically a device configuration of a light emitting element according to the invention.

In this example, a device configuration of a light emitting element and a method for manufacturing thereof according to the present invention will be explained with reference to FIG. 5.

An anode 501 of the light emitting element is formed over a glass substrate 500 having an insulating surface. As a material for the anode 501, ITO, a transparent conductive film, is used. The anode 501 is formed by sputtering to have a thickness of 110 nm. The anode 501 is square in shape and 2 mm in height and width.

Then, an electroluminescent layer 502 is formed over the anode 501. In this example, the electroluminescent layer 502 has a lamination structure comprising a hole injecting layer 511; a first light emitting layer 512, which has hole injection properties; a second light emitting layer 513; an electron transporting layer 514; and an electron injecting layer 515. The first light emitting layer 512 is formed by a material, which can achieve blue emission, specifically, a material, which has the emission spectrum with maximum intensity in the wavelength of from 400 to 500 nm. In addition, the second light emitting layer 513 is formed by a host material or a guest material that generates phosphorescent light emission.

First, a substrate provided with the anode 501 is secured with a substrate holder of a vacuum deposition system in such a way that the surface provided with the anode 501 is down. Then, Cu-Pc is put into an evaporation source installed in the internal of the vacuum deposition system. And then, the hole injection layer 511 is formed to have a thickness of 20 nm by vacuum vapor deposition with a resistive heating method.

Then, the first light emitting layer 512 is formed by a material, which has excellent hole transportation properties and light-emission properties. In this example, α-NPD is deposited in accordance with the same procedures as those conducted for forming the hole injection layer 511 to have a thickness of 30 nm.

And then, the second light emitting layer 513 is formed. In this example, the second light emitting layer 513 is formed by CBP as a host material and Pt(ppy)acac represented by the structural formula 1 as a guest material, which is controlled to be 15 wt % in concentration, to have a thickness of 20 nm by co-evaporation.

Further, the electron transporting layer 514 is formed over the second light emitting layer 513. The electron transporting layer 514 is formed by BCP (bathocuproin) to have a thickness of 20 nm by vapor deposition. CaF$_2$ is deposited to have a thickness of 2 nm as the electron injection layer 515 thereon to complete the electroluminescent layer 502 having a lamination structure.

Lastly, a cathode 503 is formed. In this example, the cathode 503 is formed by aluminum (Al) by vapor deposition with a resistive heating method to have a thickness of 100 nm.

Therefore, a light emitting element according to the invention is formed. In addition, in the device configuration described in Example 1, the first light emitting layer 512 and the second light emitting layer 513 can exhibit light emission, respectively, so that a device that exhibits white emission as a whole can be formed.

In this example, an anode was formed over a substrate; however, the invention is not limited thereto. A cathode can be formed over a substrate. In this case, that is, in case of exchanging an anode to cathode, lamination sequence of the electroluminescent layer described in this example is reversed.

In this example, the anode 501 is a transparent electrode in order to extract light generated in the electroluminescent layer 502 from the anode 501; however, the invention is not limited thereto. If the cathode 503 is formed by a selected material that is suitable for securing transmittance, light can be extracted from the cathode.

Example 2

In this example, device characteristics of the light emitting element described in Example 1 having the configuration: ITO/Cu-Pc (20 nm)/α-NPD (30 nm)/CBP+Pt(ppy)acac: 15 wt % (20 nm)/BCP (30 nm)/CaF (2 nm)/Al (100 nm) will be explained. Emission spectrum of the light emitting element having the above described configuration is shown by each spectrum 1 in FIG. 8 and FIG. 9. Each plot 1 in FIGS. 10 to 13 shows for electric characteristics.

Figure 8:
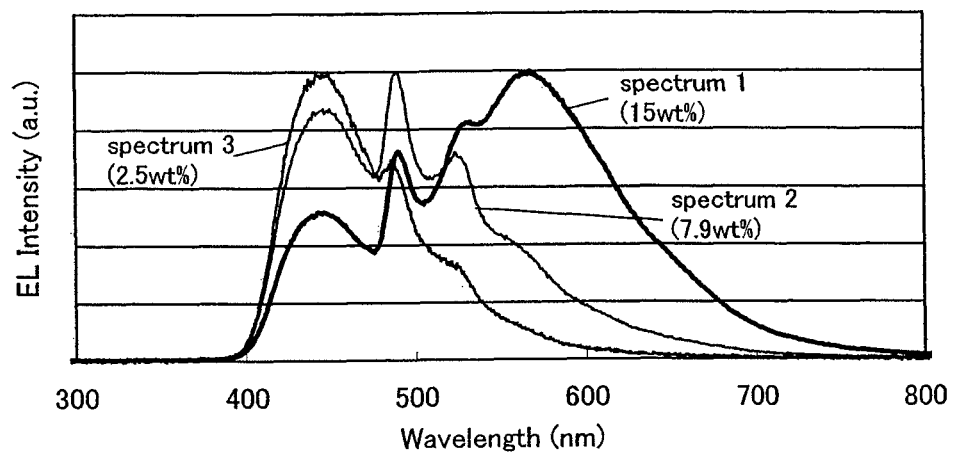
FIG. 8 shows an emission spectrum according to Example 2 and Comparative Example 1.

Spectrum 1 in FIG. 8 shows the emission spectrum of the light emitting element having the above described configuration at an applied current of 1 mA (approximately 960 cd/m$^2$). From the result shown by spectrum 1, white emission can be obtained having three components: blue emission from α-NPD composing the first light emitting layer (~450 nm); green emission of phosphorescent light emission from Pt(ppy)acac contained in a second light emitting layer (~490 nm, ~530 nm); and orange emission from excimer light emission of Pt(ppy)acac contained in the second light emitting layer. CIE chromaticity coordinate is (x, y)=(0.346, 0.397). The light emission was almost white in appearance.

Ionization potential of the α-NPD used for the first light emitting layer and the CBP used for the second light emitting layer was measured. The α-NPD had ionization potential of approximately 5.3 eV, and the CBP had that of approximately 5.9 eV. The difference in the ionization potential between the α-NPD and the CBP was approximately 0.6 eV. Therefore, preferable condition of the invention, that is, ionization potential of at least 0.4 eV is satisfied. Consequently, it can be considered that the fact resulted in good white emission. In addition, the measurement of ionization potential was carried out with photoelectron spectrometer (AC-2) (RIKEN KEIKI Co., Ltd.).

Figure 9:
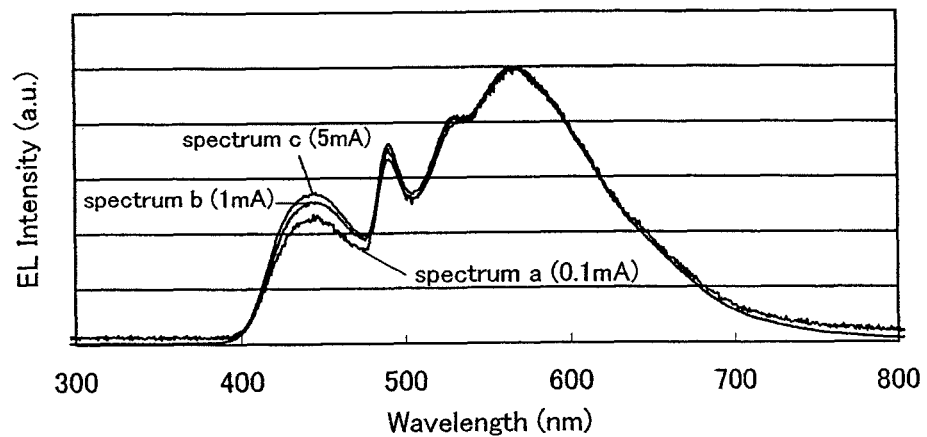
FIG. 9 shows current density dependence of an emission spectrum according to Example 2.

FIG. 9 shows measurement results of each spectrum at different amount of current flow in the light emitting element having the above described configuration. FIG. 9 shows measurement results at different amount of current flow denoted by spectrum a (0.1 mA), spectrum b (1 mA), and spectrum c (5 mA). Clearly from the measurement results, a spectral shape was hardly changed even when the amount of current flow was increased (luminance was increased). It can be considered that the light emitting element according to the invention exhibits stable white emission, which is hardly affected by the change of the amount of current flow.

Figure 10:
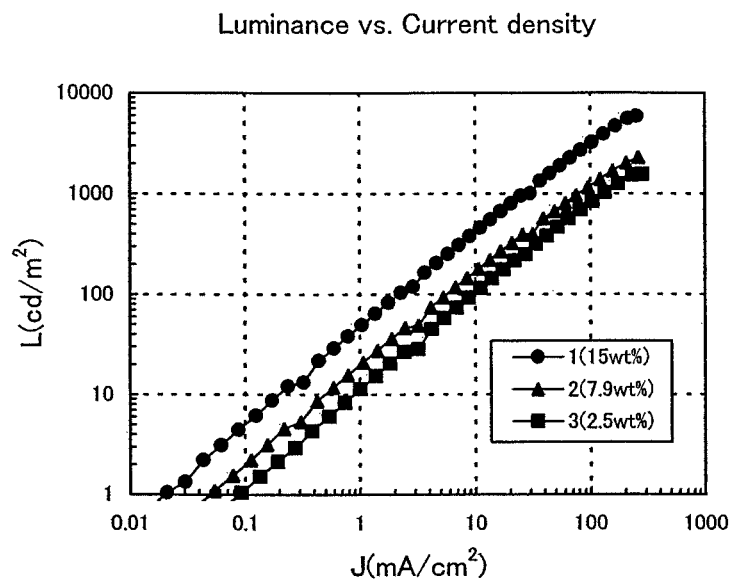
FIG. 10 shows luminance vs. current density characteristics according to Example 2 and Comparative Example 1.

As electric characteristics of the light emitting element having the above described configuration, the luminance-current plot 1 in FIG. 10 shows that a luminance of approximately 460 cd/m$^2$ was obtained at a current density of 10 mA/cm$^2$.

Figure 11:
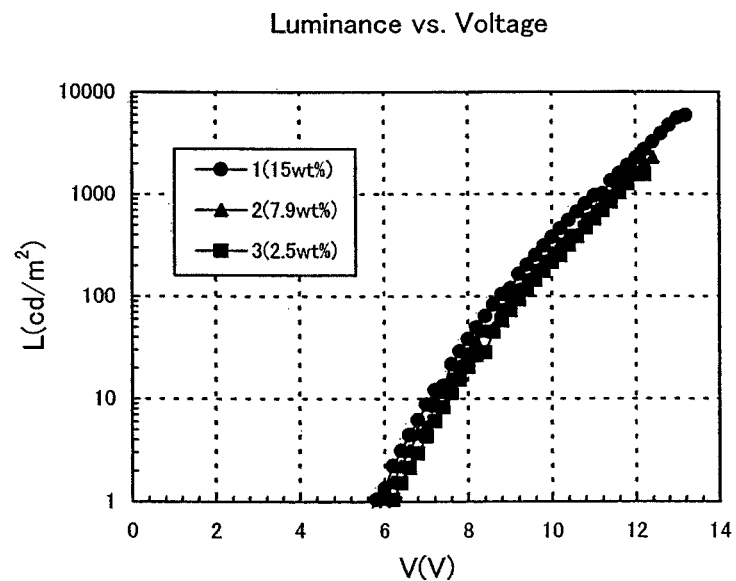
FIG. 11 shows luminance vs. voltage characteristics according to Example 2 and Comparative Example 1.

The luminance-voltage plot 1 in FIG. 11 shows that a luminance of approximately 120 cd/m$^2$ was obtained at an applied voltage of 9 V.

Figure 12:
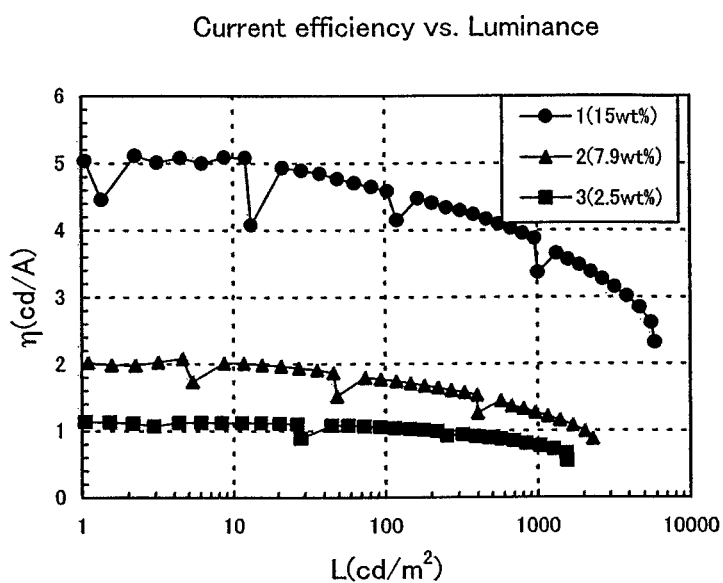
FIG. 12 shows current efficiency vs. luminance characteristics according to Example 2 and Comparative Example 1.

The current efficiency-luminance plot 1 in FIG. 12 shows that current efficiency of approximately 4.6 cd/A was obtained at a luminance of 100 cd/m$^2$.

Figure 13:
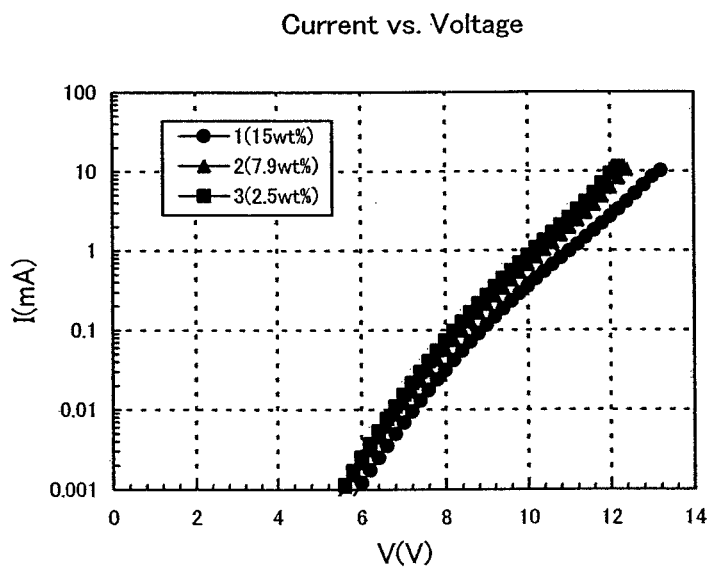
FIG. 13 shows current vs. voltage characteristics according to Example 2 and Comparative Example 1.

The current-voltage plot 1 in FIG. 13 shows that a current flow was approximately 0.12 mA at applied voltage of 9 V.

Comparative Example 1

Correspondingly, each spectrum 2 and spectrum 3 in FIG. 8 shows emission spectrum measured from a light emitting element formed by different concentration of Pt(ppy)acac contained in a light emitting layer from that in Example 1. The spectrum 2 shows a measurement result in the case that concentration of Pt(ppy)acac is 7.9 wt %. The spectrum 3 shows a measurement result in the case that concentration of Pt(ppy)acac is 2.5 wt %. In each case, the spectrum was obtained at the current flow of 1 mA.

As shown by spectrum 3 of FIG. 8, in case that Pt(ppy)acac is contained at concentration of 2.5 wt %, blue emission from α-NPD composing a first light emitting layer (approximately 450 nm) and green emission from Pt(ppy)acac contained in a second light emitting layer (approximately 490 nm, approximately 530 nm) were only observed, consequently, white emission could not be obtained. As shown in spectrum 2, in case that Pt(ppy)acac is contained at concentration of 7.9 wt %, a slight of excimer emission was in the spectrum as a shoulder at the vicinity of 560 nm; however the peak was insufficient, consequently, excellent white emission could not be obtained.

Further, current characteristics were measured from the devices. Each plot 2 in FIGS. 10 to 13 shows measurement results from the device containing Pt(ppy)acac at concentration of 7.9 wt %. Each plot 3 in FIGS. 10 to 13 shows measurement results from the device containing Pt(ppy)acac at concentration of 2.5 wt %.

The luminance-voltage characteristics in FIG. 10 shows that a luminance of approximately 180 cd/m$^2$ was obtained from the device containing Pt(ppy)acac at concentration of 7.9 wt % and a luminance of approximately 115 cd/m$^2$ was obtained from the device containing Pt(ppy)acac at concentration of 2.5 wt % at a current density of 10 mA/cm$^2$, respectively.

The luminance-voltage characteristics in FIG. 11 shows that a luminance of approximately 93 cd/m$^2$ was obtained form the device containing Pt(ppy)acac at concentration of 7.9 wt % and a luminance of approximately 73 cd/m$^2$ was obtained from the device containing Pt(ppy)acac at concentration of 2.5 wt % at an applied voltage of 9 V, respectively.

The current efficiency-luminance characteristics in FIG. 12 shows that a current efficiency of approximately 1.8 cd/A was obtained from the device containing Pt(ppy)acac at concentration of 7.9 wt % and a current efficiency of approximately 1.1 cd/A was obtained from the device containing Pt(ppy)acac at concentration of 2.5 wt % at the luminance of 100 cd/m$^2$, respectively.

The current-voltage characteristics in FIG. 13 show that a current flow was approximately 0.21 mA in the device containing Pt(ppy)acac at concentration of 7.9 wt % and a current flow was approximately 0.27 mA in the device containing Pt(ppy)acac at concentration of 2.5 wt % at an applied voltage of 9 V, respectively.

The above measurement results (especially, the result of the current-voltage characteristics) provide the fact that the light emitting element according to the invention containing Pt(ppy)acac as a guest material in high concentration (15 wt %) has the same level of electric characteristics as those of the light emitting element containing Pt(ppy)acac as a guest material in such low concentration (7.9 wt %, 2.5 wt %).

Example 3

In this example, a method for manufacturing a light emitting device (top emission structure) having a light emitting element according to the present invention, which exhibits white emission, over a substrate having an insulating surface will be explained with reference to FIG. 6. As used herein, the term "top emission structure" refers to a structure in which light is extracted from the opposite side of the substrate having an insulating surface.

Figure 6A:
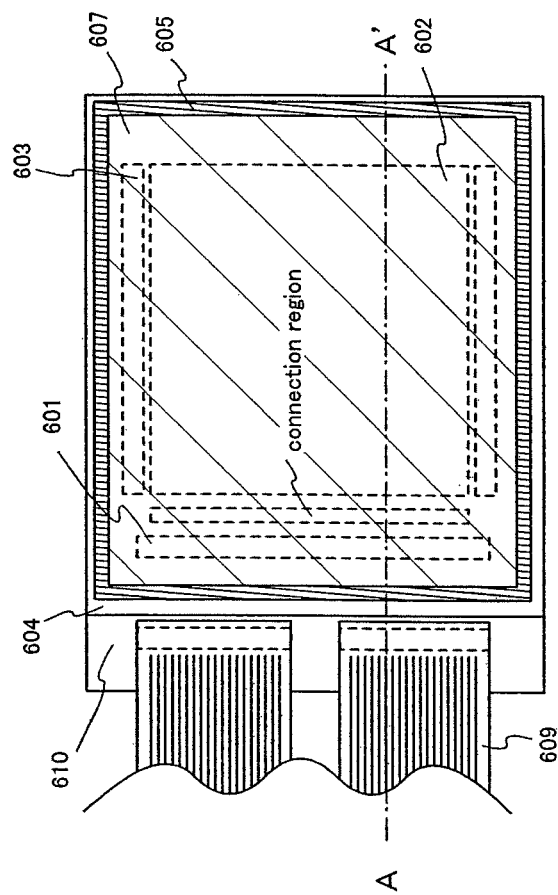
FIGS. 6A and 6B are schematic views of a light emitting device according to the invention.
Figure 6B:
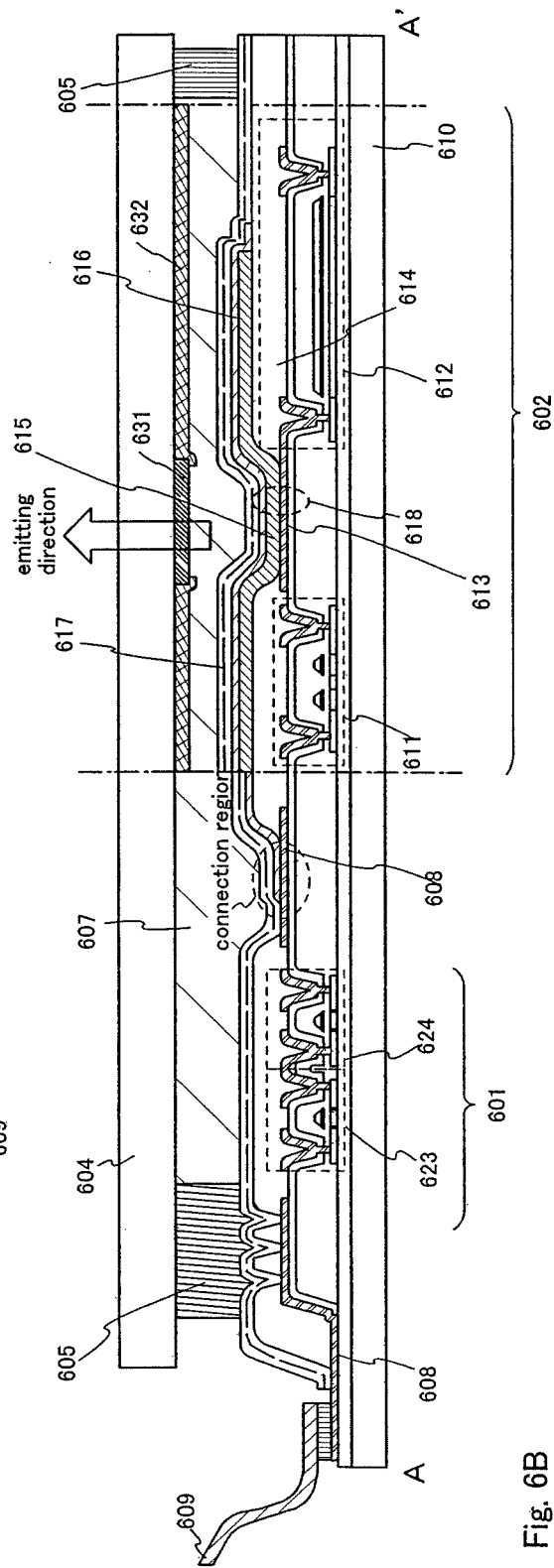

FIG. 6A is a top view of a light emitting device. FIG. 6B is a cross-sectional view of FIG. 6A taken along the line A-A'. Reference numeral 601 indicated by a dotted line denotes a source signal line driver circuit; 602, a pixel portion; 603, a gate signal line driver circuit; 604, a transparent sealing substrate; 605, a first sealing agent; and 607, a second sealing agent. The inside surrounded by the first sealing agent 605 is filled with the transparent second sealing agent 607. In addition, the first sealing agent 605 contains a gap agent for spacing between substrates.

Reference 608 denotes a wiring for transmitting signals inputted to the source signal line driver circuit 601 and the gate signal line driver circuit 603. The wiring receives video signals or clock signals from an FPC (flexible printed circuit) 609 serving as an external input terminal. Although only FPC is illustrated in the drawing, a PWB (printed wirings board) may be attached to the FPC.

Then, a cross-sectional structure will be explained with reference to FIG. 6B. A driver circuit and a pixel portion are formed over a substrate 610. In FIG. 6B, the source signal line driver circuit 601 and the pixel portion 602 are illustrated as a driver circuit.

The source signal line driver circuit 601 is provided with a CMOS circuit formed by combining an n-channel TFT 623 and a p-channel TFT 624. A TFT for forming a driver circuit may be formed by a known CMOS, PMOS, or NMOS circuit. In this example, a driver integrated type in which a driver circuit is formed over a substrate is described, but not exclusively, the driver circuit can be formed outside instead of over a substrate. In addition, the structure of a using a polysilicon film as an active layer is not especially limited. A top gate TFT or a bottom gate TFT can be adopted.

The pixel portion 602 is composed of a plurality of pixels including a switching TFT 611, a current control TFT 612, and a first electrode (anode) 613 connected to the drain of the current control TFT 612. The current control TFT 612 may be either an n-channel TFT or a p-channel TFT. In case that the current control TFT 612 is connected to an anode, the TFT is preferably a p-channel TFT. In FIG. 6B, a cross-sectional structure of only one of thousands of pixels is illustrated to show an example that two TFTs are used for the pixel. However, three or more numbers of pixels can be appropriately used.

Since the first electrode (anode) 613 is directly in contact with the drain of a TFT, a bottom layer of the first electrode (anode) 613 is preferably formed by a material capable of making an ohmic contact with the drain formed by silicon, and a top layer, which is in contact with a layer containing an organic compound, is preferably formed by a material having a large work function. In case of forming the first electrode (anode) by three layers structure comprising a titanium nitride film, a film containing aluminum as its main component, and a titanium nitride film, the first electrode (anode) can reduce resistance as a wiring, make a favorable ohmic contact, and function as an anode. Further, the first electrode (anode) 613 can be formed by a single layer such as a titanium nitride film, a chromium film, a tungsten film, a zinc film, or a platinum film; or a lamination layer composed of three or more layers.

Insulator (also referred to as a bank) 614 is formed at the edge of the first electrode (anode) 613. The insulator 614 may be formed by an organic resin film or an insulating film containing silicon. In this example, an insulator is formed by a positive type photosensitive acrylic film as the insulator 614 in the shape as illustrated in FIG. 6B.

In order to make favorable coverage, an upper edge portion and a lower edge portion of the insulator 614 are formed to have a curved face having a radius of curvature. For example, positive type photosensitive acrylic is used as a material for the insulator 614, only upper edge portion of the insulator 614 is preferably have a radius of curvature (from 0.2 to 3 µm). As the insulator 614, either a negative type photosensitive resin that becomes insoluble to etchant by light or a positive type photosensitive resin that becomes dissoluble to etchant by light can be used.

Further, the insulator 614 may be covered by a protective film formed by an aluminum nitride film, an aluminum nitride oxide film, a thin film containing carbon as its main component, or a silicon nitride film.

An electroluminescent layer 615 is selectively formed over the first electrode (anode) 613 by vapor deposition. Moreover, a second electrode (cathode) 616 is formed over the electroluminescent layer 615. As the cathode, a material having a mall work function (Al, Ag, Li, Ca; or alloys of these elements such as Mg: Ag, Mg: In, or Al: Li; or CaN) can be used.

In order to pass light, the second electrode (cathode) 616 is formed by a lamination layer of a thin metal film having a small work function and a transparent conductive film (ITO, IZO, ZnO, or the like). A light emitting element 618 is thus formed comprising the first electrode (anode) 613, the electroluminescent layer 615, and the second electrode (cathode) 616.

In this example, the electroluminescent layer 615 is formed by a lamination structure explained in Example 1. That is, the electroluminescent layer 615 is formed by stacking sequentially Cu-Pc as a hole injecting layer (20 nm), α-NPD as a first light emitting layer having hole transporting properties (30 nm), CBP+Pt(ppy)acac:15 wt % (20 nm) as a second light emitting layer, and BCP as an electron transporting layer (30 nm). In addition, an electron injecting layer ($CaF_2$) is unnecessary in the device since a thin film metal film having a small work function is stacked as the second electrode (cathode).

Thus formed light emitting element 618 exhibits white emission. In addition, a color filter comprising a coloring layer 631 and a light shielding layer (BM) 632 is provided to realize full color (for simplification, an over coat layer is not illustrated).

In order to seal the light emitting element 618, a transparent protective lamination layer 617 is formed. The transparent protective lamination layer 617 comprises a first inorganic insulating film, a stress relaxation film, and a second inorganic insulating film. As the first inorganic insulating film and the second inorganic insulating film, a silicon nitride film, a silicon oxide film, a silicon oxynitride film (composition ratio: N<O), a silicon nitride oxide film (composition ratio: N>O), or a thin film containing carbon as its main component (for example, a DLC film or a CN film) can be used. These inorganic insulating films have high blocking properties against moisture. However, when the film thickness is increased, film stress is also increased, consequently, film peeling is easily occurred.

By interposing a stress relaxation film between the first inorganic insulating film and the second inorganic insulating film, moisture can be absorbed and stress can be relaxed. Even when fine holes (such as pin holes) are existed on the first inorganic insulating film at film formation for any reason, the stress relaxation film can fill in the fine holes. The second inorganic insulating film formed over the stress relaxation film gives the transparent protective lamination film excellent blocking properties against moisture or oxygen.

A stress relaxation film is preferably formed by a material having smaller stress than that of an inorganic insulating film and hygroscopic properties. In addition, a material that is transparent to light is preferable. As the stress relaxation film, a film containing an organic compound such as α-NPD, BCP, MTDATA, or $Alq_3$ can be used. These films have hygroscopic properties and are almost transparent in case of having thin film thickness. Further, MgO, $SrO_2$, or SrO can be used as the stress relaxation film since they have hygroscopic properties and translucency, and can be formed into a thin film by vapor deposition.

In this example, a silicon nitride film having high blocking properties against impurities such as moisture or alkaline metals is formed by vapor deposition using a silicon target in the atmosphere containing nitrogen and argon as the first inorganic insulating film or the second inorganic insulating film. A thin film formed by $Alp_3$ by vapor deposition as the stress relaxation film. In order to pass light through the transparent protective lamination layer, the total film thickness of the transparent protective lamination layer is preferably formed to be thin as possible.

In order to seal the light emitting element 618, the sealing substrate 604 is pasted with the first sealing agent 605 and the second sealing agent 607 in an inert gas atmosphere. Epoxy resin is preferably used for the first sealing agent 605 and the second sealing agent 607. It is desirable that the first sealing agent 605 and the second sealing agent 607 inhibit moisture or oxygen as possible.

In this example, as a material for the sealing substrate 604, a plastic substrate formed by FRP (Fiberglass-Reinforced Plastics), PVF (polyvinyl fluoride), Myler, polyester, acrylic, or the like can be used besides a glass substrate or a quartz substrate. After pasting the sealing substrate 604 with the first sealing agent 605 and the second sealing agent 607, a third sealing agent can be provided to seal the side face (exposed face).

By encapsulating the light emitting element 618 in the first sealing agent 605 and the second sealing agent 607, the light emitting element 618 can be shielded completely from outside to prevent moisture or oxygen that brings deterioration of the electroluminescent layer 615 from penetrating into the light emitting element 618. Therefore a high reliable light emitting device can be obtained.

If the first electrode (anode) 613 is formed by a transparent conductive film, a dual light emission device can be manufactured.

The light emitting device according to this example can be practiced by utilizing not only the device configuration of the electroluminescent device explained in Example 1 but also the configuration of the electroluminescent device according to the invention.

Example 4

Various electric appliances completed by using a light emitting device having a light emitting element according to the present invention will be explained in this example.

Given as examples of such electric appliances manufactured by using the light emitting device having the light emitting element according to the invention: a video camera, a digital camera, a goggles-type display (head mount display), a navigation system, a sound reproduction device (a car audio equipment, an audio set and the like), a laptop personal computer, a game machine, a portable information terminal (a mobile computer, a cellular phone, a portable game machine, an electronic book, or the like), an image reproduction device including a recording medium (more specifically, a device which can reproduce a recording medium such as a digital versatile disc (DVD) and so forth, and includes a display for displaying the reproduced image), or the like. FIGS. 7A to 7G show various specific examples of such electric appliances.

Figure 7A:
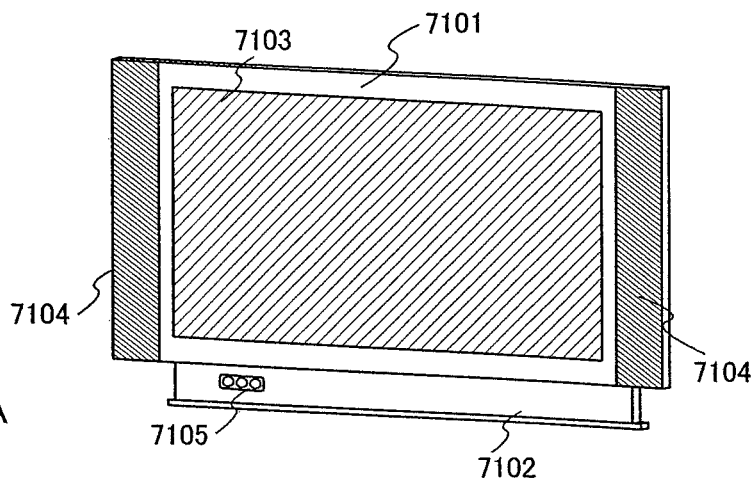
FIGS. 7A to 7G show examples of electric appliances using a light emitting device according to the invention.

FIG. 7A illustrates a display device which includes a frame 7101, a support table 7102, a display portion 7103, a speaker portion 7104, a video input terminal 7105, or the like. The light emitting device using the light emitting element according to the invention can be used for the display portion 7103. The display device is including all of the display devices for displaying information, such as a personal computer, a receiver of TV broadcasting, and an advertising display.

Figure 7B:
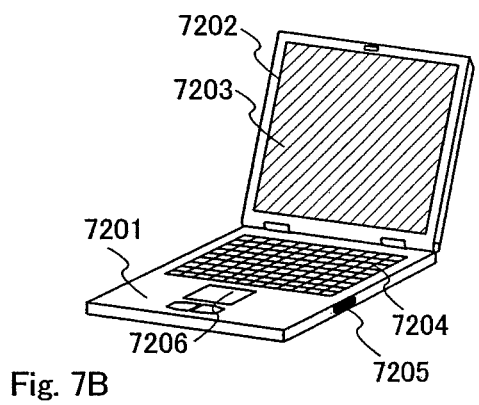

FIG. 7B illustrates a laptop computer which includes a main body 7201, a casing 7202, a display portion 7203, a keyboard 7204, an external connection port 7205, a pointing mouse 7206, or the like. The light emitting device using the light emitting element according to the invention can be used to the display portion 7203.

Figure 7C:
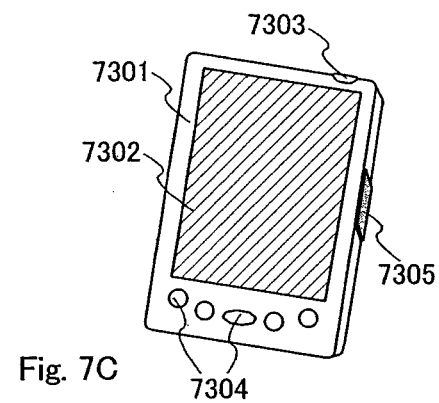

FIG. 7C illustrates a mobile computer which includes a main body 7301, a display portion 7302, a switch 7303, an operation key 7304, an infrared port 7305, or the like. The light emitting device using the light emitting element according to the invention can be used to the display portion 7302.

Figure 7D:
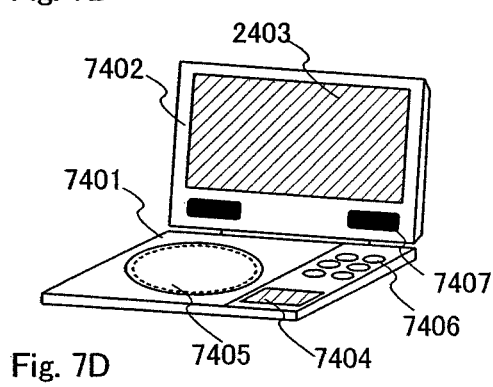

FIG. 7D illustrates an image reproduction device including a recording medium (more specifically, a DVD reproduction device), which includes a main body 7401, a casing 7402, a display portion A 7403, another display portion B 7404, a recording medium (DVD or the like) reading portion 7405, an operation key 7406, a speaker portion 7407 or the like. The display portion A 7403 is used mainly for displaying image information, while the display portion B 7404 is used mainly for displaying character information. The light emitting device using the light emitting element according to the invention can be used to the display portion A 7403 and the display portion B 7404. Note that the image reproduction device including a recording medium further includes a domestic game machine or the like.

Figure 7E:
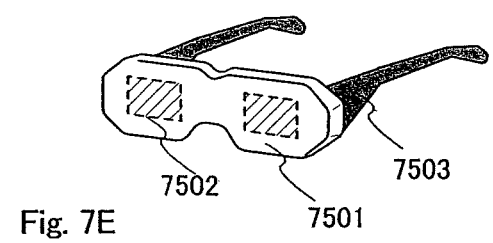

FIG. 7E illustrates a goggle type display (head mounted display), which includes a main body 7501, a display portion 7502, and an arm portion 7503. The light emitting device using the light emitting element according to the invention can be used to the display portion 7502.

Figure 7F:
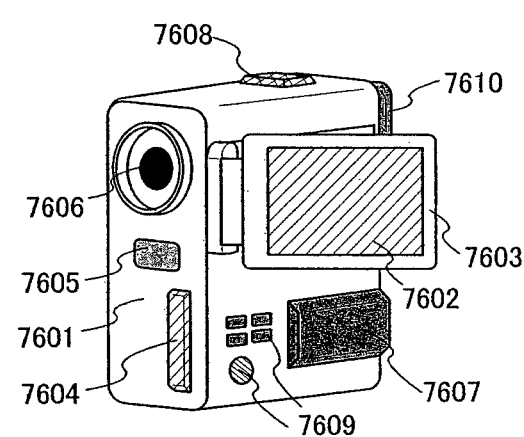

FIG. 7F illustrates a video camera which includes a main body 7601, a display portion 7602, an casing 7603, an external connecting port 7604, a remote control receiving portion 7605, an image receiving portion 7606, a battery 7607, a sound input portion 7608, an operation key 7609, an eyepiece portion 7610 or the like. The light emitting device using the light emitting element according to the invention can be used to the display portion 7602.

Figure 7G:
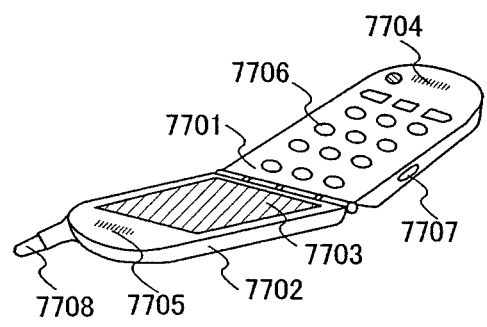

FIG. 7G illustrates a cellular phone which includes a main body 7701, a casing 7702, a display portion 7703, a sound input portion 7704, a sound output portion 7705, an operation key 7706, an external connecting port 7707, an antenna 7708, or the like. The light emitting device using the light emitting element according to the invention can be used to the display portion 7703. Note that the display portion 7703 can reduce power consumption of the cellular phone by displaying white-colored characters on a black-colored background.

As set forth above, the light emitting device using the light emitting element according to the invention can be applied variously to a wide range of electric appliances in all fields. The light emitting device can be applied to various fields' electric appliances.

By practicing the present invention, a white light emitting element having high light emission efficiency can be provided. Especially, a high efficient white light emitting device, which has the peak intensity in each wavelength region of red, green, and blue, can be provided. Moreover, by manufacturing a light emitting device using the light emitting element, a light emitting device, which operates at lower power than that of the conventional light emitting device, can be provided.

What is claimed is:

1. A light emitting device comprising:
   an anode and a cathode;
   a first light emitting layer between the anode and the cathode, the first light emitting layer comprising a first host material and a blue-emissive guest material; and
   a second light emitting layer between the first light emitting layer and the cathode, the second light emitting layer being in contact with the first light emitting layer and containing a host material and a phosphorescent material,
   wherein the phosphorescent material simultaneously generates phosphorescent emission in green wavelength region and excimer emission in red wavelength region,
   wherein the blue-emissive guest material is dispersed in the first host material, and
   wherein ionization potential of the second light emitting layer is larger by 0.4 eV than that of the blue-emissive guest material.

2. The light emitting device according to claim 1, wherein the first light emitting layer exhibits blue emission.

3. The light emitting device according to claim 1, wherein the phosphorescent material is an organic metal complex with platinum as a central metal.

4. The light emitting device according to claim 3, wherein the organic metal complex is selected from

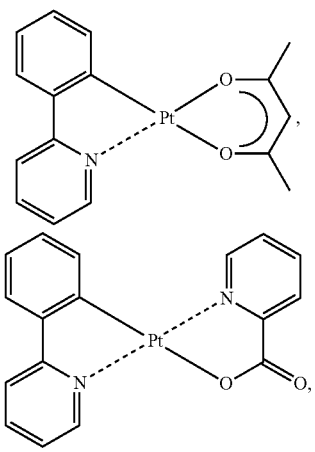

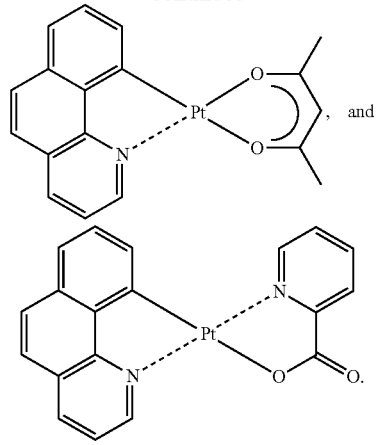

5. The light emitting device according to claim 1, wherein the first light emitting layer has an emission peak in a wavelength region from 400 nm to 500 nm.

6. The light emitting device according to claim 5, wherein the phosphorescent material has at least two emission peaks at a wavelength region from 500 nm to 700 nm, and at least one of the emission peaks corresponds to the excimer emission.

7. The light emitting device according to claim 1, wherein the phosphorescent material is dispersed in the host material at a concentration of at least 15 wt %.

8. The light emitting device according to claim 1, wherein the light emitting device emits white light.

9. The light emitting device according to claim 1, further comprising a hole injecting layer between the anode and the first light emitting layer.

10. The light emitting device according to claim 9, wherein the hole injecting layer comprises a metal oxide.

11. An electric appliance comprising the light emitting device according to claim 1.

12. A semiconductor device comprising the light emitting device according to claim 1.

13. A light emitting device comprising:
    a first electrode;
    a first light emitting layer over the first electrode, the first light emitting layer comprising a first host material and a blue-emissive guest material;
    a second light emitting layer over and in contact with the first light emitting layer, the second light emitting layer containing a host material and a phosphorescent material, and
    a second electrode over the second light emitting layer,
    wherein the phosphorescent material simultaneously generates phosphorescent emission in green wavelength region and excimer emission in red wavelength region,
    wherein the blue-emissive guest material is dispersed in the first host material, and
    wherein ionization potential of the second light emitting layer is larger by 0.4 eV than that of the blue-emissive guest material.

14. The light emitting device according to claim 13, wherein the first light emitting layer exhibits blue emission.

15. The light emitting device according to claim 13, wherein the phosphorescent material is an organic metal complex with platinum as a central metal.

16. The light emitting device according to claim 15, wherein the organic metal complex is selected from

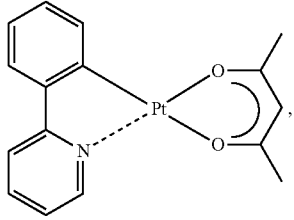

,

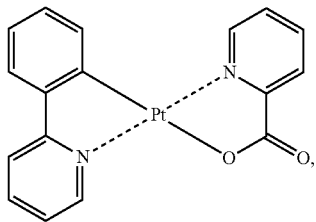

,

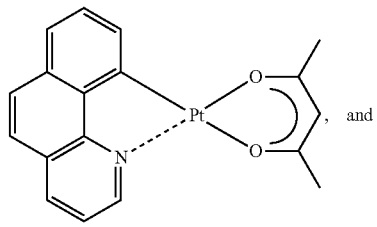

, and

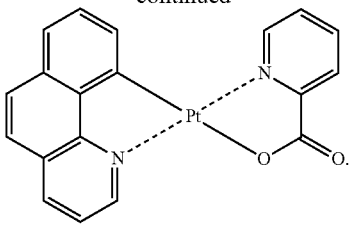

.

17. The light emitting device according to claim 13, wherein the first light emitting layer has an emission peak in a wavelength region from 400 nm to 500 nm.

18. The light emitting device according to claim 17, wherein the phosphorescent material has at least two emission peaks at a wavelength region from 500 nm to 700 nm, and at least one of the emission peaks corresponds to the excimer emission.

19. The light emitting device according to claim 13, wherein the phosphorescent material is dispersed in the host material at a concentration of at least 15 wt %.

20. The light emitting device according to claim 13, wherein the light emitting device emits white light.

21. The light emitting device according to claim 13, further comprising a hole injecting layer over and in contact with the first electrode.

22. The light emitting device according to claim 21, wherein the hole injecting layer comprises a metal oxide.

23. An electric appliance comprising the light emitting device according to claim 13.

24. A semiconductor device comprising the light emitting device according to claim 13.

* * * * *